US010335896B2

United States Patent
Berg et al.

(10) Patent No.: US 10,335,896 B2
(45) Date of Patent: Jul. 2, 2019

(54) BORESIGHTING A LASER TO AN IMAGING SENSOR SYSTEMS AND METHODS

(71) Applicant: FLIR Systems, Inc., Wilsonville, OR (US)

(72) Inventors: Lawrence Berg, N. Grafton, MA (US); Henry Kelley, Woburn, MA (US); Stephen C. Collins, Bozeman, MT (US); Zachary Cole, Bozeman, MT (US); Randy W. Equall, Bozeman, MT (US)

(73) Assignee: FLIR Systems, Inc., Wilsonville, OR (US)

( * ) Notice: Subject to any disclaimer, the term of this patent is extended or adjusted under 35 U.S.C. 154(b) by 100 days.

(21) Appl. No.: 15/650,542

(22) Filed: Jul. 14, 2017

(65) Prior Publication Data

US 2019/0015930 A1 Jan. 17, 2019

Related U.S. Application Data

(60) Provisional application No. 62/363,163, filed on Jul. 15, 2016.

(51) Int. Cl.
*B23K 26/04* (2014.01)
*H01S 3/16* (2006.01)
*B23K 26/062* (2014.01)

(52) U.S. Cl.
CPC .......... *B23K 26/043* (2013.01); *B23K 26/062* (2015.10); *H01S 3/1643* (2013.01)

(58) Field of Classification Search
USPC ...................................... 250/504 R
See application file for complete search history.

(56) References Cited

U.S. PATENT DOCUMENTS

| | | | | | |
|---|---|---|---|---|---|
| 5,838,014 | A | * | 11/1998 | Cabib | F41G 1/54 250/504 R |
| 6,556,352 | B2 | * | 4/2003 | Wang | G02B 27/09 359/641 |

(Continued)

OTHER PUBLICATIONS

Moulton et al., "Spectroscopic and Laser Characteristics of Er,Cr: YSGG", IEEE Journal of Quantum Electronics, Jun. 1988, pp. 960-973, vol. 24, No. 6, IEEE Photonics Society, Piscataway, NJ.

(Continued)

*Primary Examiner* — Phillip A Johnston
(74) *Attorney, Agent, or Firm* — Haynes and Boone, LLP

(57) ABSTRACT

Techniques are disclosed for an improved boresighting apparatus and related method for boresighting a light source to an imaging sensor, and for an improved material to be used in a target object in such a boresighting apparatus. For example, an apparatus for use in boresighting may include a catadioptric element and a target object, where the catadioptric element is configured to focus a laser beam from the light source and also to collimate light emitted from the target object at a different wavelength than the laser beam to be detected by the imaging sensor for indicating the location of the focused laser beam. The target object may, for example, comprises a fluorescent optical material doped with one or more optically active ions to absorb light having the wavelength of the laser beam and emit light in one or more wavebands detectable by the imaging sensors.

22 Claims, 6 Drawing Sheets

(56) References Cited

U.S. PATENT DOCUMENTS 6,734,448 B2 * 5/2004 Kongable ............ B23K 26/04
                                                    250/330
9,414,477 B2 * 8/2016 Loopstra ............ G03F 7/70033

OTHER PUBLICATIONS

Lupei et al., "On the Dynamics of Population Inversion for 3 μm $Er^{3+}$ Lasers", IEEE Journal of Quantum Electronics, Feb. 1993, pp. 426-434, vol. 29, No. 2, IEEE Photonics Society, Piscataway, NJ.

Pollack et al., "Upconversion-pumped 2.8-2.9-μm lasing of $Er^{3+}$ ion in garnets", Journal of Applied Physics, Dec. 15, 1991, pp. 7227-7239, vol. 70, No. 12, American Institute of Physics, College Park, MD.

Kück et al., "Near-infrared emission of $Cr^{4+}$-doped garnets: Lifetimes, quantum efficiencies, and emission cross sections", Physical Review B: Condensed Matter, Jun. 15, 1995, pp. 17323-17331, Third Series, vol. 51, No. 24, The American Physical Society, College Park, MD.

Kalisky, Yehoshua, "$Cr^{4+}$-doped crystals: their use as lasers and passive Q-switches", Progress in Quantum Electronics, 2004, pp. 249-303, vol. 28, Issue 5, Elsevier Ltd., Amsterdam, Netherlands.

* cited by examiner

BORESIGHTING A LASER TO AN IMAGING SENSOR SYSTEMS AND METHODS

CROSS-REFERENCE TO RELATED APPLICATIONS

This application claims the benefit of and priority to U.S. Provisional Patent Application No. 62/363,163 filed Jul. 15, 2016 and entitled "APPARATUS AND METHOD FOR BORESIGHTING LASER TO IMAGING SENSORS," which is incorporated herein by reference in its entirety.

TECHNICAL FIELD

One or more embodiments of the disclosure relate generally to boresighting apparatuses and methods, and more particularly, for example, to apparatuses and methods for boresighting a laser beam to one or more imaging sensors.

BACKGROUND

Many imaging systems, such as those used in surveillance and targeting systems, include a laser or other light beam projector, such as a laser pointer, laser rangefinder, or laser designator for target designation, rangefinding, or other uses. To ensure accurate aim of the laser beam, the laser beam is typically boresighted (e.g., aligned) to an imaging sensor of the imaging system, for example, to the location of a reticle displayed in images captured by the imaging sensor. For laser designation in military weapons systems, boresighting of laser designators to imaging sensors is of significant importance for accurate delivery of ordinance. However, the alignment between the laser beam and the imaging sensor inevitably drifts over time and temperature.

To account for the drift in the alignment, some imaging systems are provided with a boresighting module to perform rapid, automatic boresighting periodically or prior to using the laser beam in the field. However, due to the complex optical arrangement, conventional boresighting modules are typically too complex and bulky for compact applications that fit within and/or selectively move in and out of the optical path of imaging system package. Furthermore, for a target object utilized in boresighting, conventional boresighting modules typically enclose a thermal target that burns away or otherwise deteriorates over use and must be replaced regularly. While imaging systems for surveillance and targeting often include multiples imaging sensors with different wavelength responsivity, conventional boresighting modules typically do not allow for simultaneous boresighting of multiple imaging sensors in imaging systems.

SUMMARY

Various techniques are disclosed for an improved boresighting apparatus and related method for boresighting a light source to an imaging sensor, and for an improved material to be used in a target object in such a boresighting apparatus. For example, an apparatus, for use in boresighting a light source emitting a laser beam at a first wavelength to an imaging sensor having a detectable waveband, may include: a catadioptric element configured to transmit and focus the laser beam onto a location in a focal plane; and a target object positioned substantially at the focal plane and configured to emit, from a spot corresponding to the location of the focused laser beam, light having a second wavelength within the detectable waveband of the imaging sensor in response to receiving the laser beam having the first wavelength, where the catadioptric element is further configured as a collimating mirror to reflect the emitted light from the spot on the target object into a collimated emitted light having the second wavelength to be detected by the imaging sensor for indicating the location of the focused laser beam. According to some embodiments, the imaging sensor may be a mid-wave infrared (MWIR) imaging sensor having the detectable waveband within a range of approximately 3 to 8 micrometers, while the laser beam may be emitted by a laser source such as a Nd:YAG or a Yb:YAG laser source at the first wavelength between approximately 600 nanometers and 1100 nanometers.

In some embodiments, the catadioptric element may be a positive meniscus lens with an outer surface having a first radius of curvature and an inner surface having a second radius of curvature larger than the first radius of curvature, the positive meniscus lens being configured to focus the laser beam entering the outer surface and exiting the inner surface onto the location in the focal plane. The inner surface of the positive meniscus lens may comprise a dichroic coating configured to transmit light having the first wavelength and reflect light having the second wavelength, whereby the inner surface of the positive meniscus lens is configured as the collimating mirror. The first and the second radii of curvature of the positive meniscus lens may be chosen to provide a focal length with respect to the focused laser beam that is substantially same as a focal length of the collimating mirror.

In some embodiments, the apparatus may further include an input mirror positioned to receive the laser beam from the light source and direct the laser beam toward the catadioptric element and/or an output mirror positioned to receive the collimated emitted light from the catadioptric element and direct the collimated emitted light toward the imaging sensor. In some embodiments, a lens may be provided between the input mirror and the catadioptric element to compensate for angular magnification introduced by the catadioptric element and/or the input mirror or the output mirror comprises a fold mirror configured to compensate for tilting of the apparatus relative to the light source and the imaging sensor by making the laser beam to the input mirror and the collimated emitted light from the output mirror substantially parallel to each other.

In some embodiments, the apparatus may be further configured to provide for simultaneous boresighting of multiple imaging sensors of different types in an imaging system. For example, the apparatus may further comprise a dichroic mirror disposed between the catadioptric element and the output mirror, the dichroic mirror being configured to pass the collimated emitted light having the second wavelength to the output mirror and reflect the collimated emitted light having a third wavelength toward an additional imaging sensor for boresighting the additional imaging sensor to the light source, where the target object is further configured to emit light having the third wavelength within the detectable waveband of the additional imaging sensor in response to receiving the laser beam, the detectable wavebands of the two imaging sensors being different from each other. The imaging sensor and the additional imaging sensor may be a short-wave infrared (SWIR) imaging sensor having the detectable waveband within a range of approximately 1 to 3 micrometers and a mid-wave infrared (MWIR) imaging sensor having the detectable waveband within a range of approximately 3 to 8 micrometers, respectively.

In another example, the apparatus may further comprise a beam splitter disposed between the input mirror and the catadioptric element, the beam splitter being configured to split the laser beam from the input mirror into a first laser beam directed toward the catadioptric element and a second laser beam directed toward an additional imaging sensor having a detectable waveband that includes the first wavelength of the laser beam for boresighting the second imaging sensor to the light source.

The imaging sensor and the additional sensor may be a mid-wave infrared (MWIR) imaging sensor having the detectable waveband within a range of approximately 3 to 8 micrometers and a visible light-near infrared (Vis-NIR) imaging sensor having the detectable waveband within a range of approximately 0.3 to 1 micrometers, respectively.

In some embodiments, the target object may comprise a fluorescent optical material configured to absorb light having the first wavelength and emit light having the second wavelength by atomic electron transition. The fluorescent optical material may be a garnet material co-doped with optically active ions such as $Cr^{4+}$ ions and $Er^{3+}$ ions to absorb light having the wavelength of the laser beam in the 1 micrometer region (e.g., 1.064 um or 1.030 urn characteristic wavelengths of a Nd:YAG and Yb:YAG laser source, respectively) and emit radiation at both the 1.5-micron region (e.g., 1.3 to 1.6 microns) and at the 3-micron region (e.g., 2.7 to 2.9 microns), detectable by a SWIR and MWIR imaging sensors, respectively.

Embodiments of the disclosure also include a material for wavelength conversion of radiation for various applications where wavelength conversion is needed or desired, including but not limited to applications in an apparatus for boresighting. For example, the material may have a doped garnet structure of $Cr,AE,Er:RE_3A_2D_3O_{12}$ (Formula I), wherein RE is a host trivalent rare earth metal cation at a dodecahedral garnet site and comprises $Y^{3+}$, $Lu^{3+}$, and/or $Gd^{3+}$; A is a host trivalent cation at an octahedral garnet site and comprises $Al^{3+}$, $Ga^{3+}$, and/or $Sc^{3+}$; D is a host trivalent cation at a tetrahedral garnet site and comprises $Al^{3+}$ and/or $Ga^{3+}$; O is a host divalent oxygen anion ($O^{2-}$); Cr is a dopant tetravalent chromium cation ($Cr^{4+}$) and substitutes for D at the tetrahedral garnet site; AE is a dopant divalent alkaline earth metal cation comprising $Ca^{2+}$ that substitutes for RE at the dodecahedral garnet site and/or $Mg^{2+}$ that substitutes for D at the tetrahedral garnet site; and Er is a dopant trivalent erbium cation ($Er^{3+}$) and substitutes for RE at the dodecahedral garnet site.

According to various embodiments, Cr may substitute for D in an amount ranging from about 0.01 to about 1 atomic percent, the amount of AE may be equal or about equal to the amount of Cr such that the material is electrically neutral or about neutral, Er may substitute for D in an amount ranging from about 5 to about 100 percent, Cr may be structurally arranged in the doped garnet structure to absorb radiation having a wavelength ranging from about 0.7 to about 1.3 microns and emit radiation having a wavelength ranging from about 1.2 to about 1.7 microns, and/or the Er may be structurally arranged in the doped garnet structure to absorb the Cr-emitted radiation and emit radiation having a wavelength ranging from about 2.6 to about 3.3 microns.

In another example, the material may have a doped garnet structure of

$$Cr_{(z)},Ca_{(x)},Er_{(y)}:Y_{(3-x-y)}Al_{(5-z)}O_{12} \quad \text{(Formula II)},$$

wherein: Y is a host trivalent yittium cation ($Y^{3+}$) at the dodecahedral garnet site; Al is a host trivalent aluminum cation ($Al^{3+}$) at the octahedral garnet site and the tetrahedral garnet site; Cr substitutes for Al at the tetrahedral garnet site; Ca is a dopant divalent calcium cation ($Ca^{2+}$) and substitutes for Y at the dodecahedral garnet site; and Er substitutes for Y at the dodecahedral garnet site.

The material for wavelength conversion of radiation according to one or more embodiments may have an absorption at a near infrared (NIR) region and an emission in a short-wave infrared (SWIR) region and a mid-wave infrared (MWIR) region. For example, the NIR region may range from about 0.7 microns to about 1.4 microns, the SWIR region may range from about 1.4 microns to about 3 microns, and the MWIR region range from about 3 microns to about 8 microns.

A method of providing the material for wavelength conversion of radiation is also disclosed in accordance with various embodiments of the disclosure. For example, the method may include: mixing $Cr_2O_3$, $AECO_3$ and/or AEO, $Er_2O_3$, $RE_2O_3$, $A_2O_3$, and $D_2O_3$ to form a mixture; and forming an optical material from the mixture, the optical material having a garnet structure comprising $RE_3A_2D_3O_{12}$ doped with Cr, AE, and Er, wherein: RE is a trivalent rare earth metal cation comprising $Y^{3+}$, $Lu^{3+}$, and/or $Gd^{3+}$; A is a trivalent cation comprising $Al^{3+}$, $Ga^{3+}$, and/or $Sc^{3+}$; D is a trivalent cation comprising $Al^{3+}$ and/or $Ga^{3+}$; O is a divalent oxygen anion ($O^{2-}$); Cr is a tetravalent chromium cation ($Cr^{4+}$); AE is a divalent alkaline earth metal cation comprising $Ca^{2+}$ and/or $Mg^{2+}$; and Er is a trivalent erbium cation ($Er^{3+}$). In some embodiments, the forming may comprise: heating the mixture to a temperature of about 1960° C. to form a molten mixture; and immersing a seed crystal in the molten mixture to grow the optical material.

In some embodiments, the mixing may comprise mixing: $Cr_2O_3$ in an amount of from about 0.1 to about 0.16 mol percent of the mixture; $AECO_3$ and/or AEO in an amount of from about 0.3 to about 0.47 mol percent of the mixture; $Er_2O_3$ in an amount of from about 16.8 to about 20.6 mol percent of the mixture; $RE_2O_3$ in an amount of from about 16.8 to about 20.6 mol percent of the mixture; $A_2O_3$ in an amount of from about 33.6 to about 41 mol percent of the mixture; and $D_2O_3$ in an amount of from about 22.3 to about 27.3 mol percent of the mixture. As a more specific example, the mixing may comprise mixing: $Cr_2O_3$ in an amount of from about 0.1 to about 0.16 mol percent of the mixture; $AECO_3$ and/or AEO in an amount of from about 0.3 to about 0.47 mol percent of the mixture; $Er_2O_3$ in an amount of from about 16.8 to about 20.6 mol percent of the mixture; $RE_2O_3$ in an amount of from about 16.8 to about 20.6 mol percent of the mixture; $A_2O_3$ in an amount of from about 33.6 to about 41 mol percent of the mixture; and $D_2O_3$ in an amount of from about 22.3 to about 27.3 mol percent of the mixture. In one example, $Er_2O_3$ may be mixed in an amount in mols that is equal or substantially equal to an amount of $RE_2O_3$ in mols.

In some embodiments, $AECO_3$ and/or AEO may be $CaCO_3$, $RE_2O_3$ may be $Y_2O_3$, and $A_2O_3$ and $D_2O_3$ may be $Al_2O_3$, wherein the mixing comprises mixing: $Cr_2O_3$ in an amount of about 0.11 parts by weight per 100 parts of the mixture by weight; $CaCO_3$ in an amount of about 0.22 parts by weight per 100 parts of the mixture by weight; $Er_2O_3$ in an amount of about 40.24 parts by weight per 100 parts of the mixture by weight; $Y_2O_3$ in an amount of about 23.74 parts by weight per 100 parts of the mixture by weight; and $Al_2O_3$ in an amount of about 35.68 parts by weight per 100 parts of the mixture by weight.

Embodiments of the disclosure also include a method of boresighting a light source emitting a laser beam at a first wavelength to an imaging sensor having a detectable waveband. For example, the method may include: receiving the laser beam at a catadioptric element; transmitting and focusing the laser beam by the catadioptric element onto a location in a focal plane associated with the catadioptric element; receiving, by a target object positioned substantially at the focal plane, the laser beam focused at the location in the focal plane; emitting, from a spot on the target object corresponding to the location of the focused laser light, light having a second wavelength within the detectable waveband of the imaging sensor in response to the receiving of the focused laser beam; and reflecting, by a collimating mirror provided by the catadioptric element, the emitted light from the spot on the target object into a collimated emitted light having the second wavelength to be detected by the imaging sensor for indicating the location of the focused laser beam. According to some embodiments, the imaging sensor may be a mid-wave infrared (MWIR) imaging sensor having the detectable waveband within a range of approximately 3 to 8 micrometers, while the laser beam may be emitted by a Nd:YAG laser source at 1064 nanometers or by a Yb:YAG laser source at 1030 nanometers.

In some embodiments, the transmitting and focusing of the laser beam and the reflecting of the emitted light by the catadioptric element may be by a positive meniscus lens with an outer surface having a first radius of curvature and an inner surface having a second radius of curvature larger than the first radius of curvature, the laser beam entering the outer surface and exiting the inner surface to be focused onto the location in the focal plane. The reflecting of the emitted light may be performed by the inner surface of the positive meniscus lens that comprises a dichroic coating configured to transmit light having the first wavelength and reflect light having the second wavelength to provide the collimating mirror. The first and the second radii of curvature of the positive meniscus lens may be chosen to provide a focal length with respect to the focused laser beam that is substantially same as a focal length of the collimating mirror.

In some embodiments, the method may further comprise: receiving the laser beam from the light source and directing the laser beam toward the catadioptric element by an input mirror, prior to receiving of the laser beam by the catadioptric element; and/or receiving the collimated emitted light from the catadioptric element and directing the collimated emitted light toward the imaging sensor by an output mirror, after the reflecting of the emitted light by the catadioptric element. In some embodiments, the method may further comprise: compensating for angular magnification introduced by the catadioptric element using a lens disposed between the input mirror and the catadioptric element; and/or compensating for tilting of the apparatus relative to the light source and the imaging sensor by making the laser beam to the input mirror and the collimated emitted light from the output mirror substantially parallel to each other using a fold mirror provided in the input or the output mirror.

In some embodiments, the method may further provide for simultaneous boresighting of multiple imaging sensors of different types in an imaging system. For example, the method may further comprise: emitting, from the spot on the target object corresponding to the location of the focused laser light, light having a third wavelength within a detectable waveband of an additional imaging sensor in response to the receiving of the focused laser beam, the detectable wavebands of the two imaging sensors being different from each other; reflecting, by the collimating mirror provided by the catadioptric element, the emitted light having the third wavelength into a collimated emitted light having the third wavelength; and prior to the receiving of the emitted light by the output mirror, passing the collimated emitted light having the second wavelength to the output mirror and reflecting the collimated emitted light having the third wavelength toward the second imaging sensor for boresighting the second imaging sensor to the light source. The imaging sensor and the additional imaging sensor may be a short-wave infrared (SWIR) imaging sensor having the detectable waveband within a range of approximately 1 to 3 micrometers and a mid-wave infrared (MWIR) imaging sensor having the detectable waveband within a range of approximately 3 to 8 micrometers, respectively.

In another example, the method may further comprise, prior to the receiving of the laser beam by the catadioptric element, splitting the laser beam from the input mirror into a first laser beam directed toward the catadioptric element and a second laser beam directed toward an additional imaging sensor having a detectable waveband that includes the first wavelength of the laser beam for boresighting the second imaging sensor to the light source. The imaging sensor and the additional sensor may be a mid-wave infrared (MWIR) imaging sensor having the detectable waveband within a range of approximately 3 to 8 micrometers and a visible light-near infrared (Vis-NIR) imaging sensor having the detectable waveband within a range of approximately 0.3 to 1 micrometers, respectively.

In some embodiments, the emitting of the light having the second wavelength may comprise absorbing light having the first wavelength and emitting light having the second wavelength by a fluorescent material comprised in the target object. For example, the emitting may be performed using the target object comprising the material for wavelength conversion of radiation discussed above.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Various embodiments disclosed herein may provide improved boresighting apparatuses and related methods for boresighting a light source, such as a laser beam projector, to an imaging sensor. In one aspect, a boresighting apparatus and method according to one or more embodiments of the disclosure utilize a catadioptric optical configuration for both focusing and collimation that advantageously permits reduction in complexity and size, for example, compared with conventional boresighting modules that employ complex reflective optical configurations.

In another aspect, a boresighting apparatus and method according to one or more embodiments of the disclosure provide a target object for boresighting that comprises a fluorescent optical material configured to absorb light in a waveband including the wavelength of the laser beam and emit light in one or more infrared wavebands, for example, both a short-wave infrared (SWIR) waveband and a mid-wave infrared (MWIR) waveband, by atomic electron transition. In another aspect, boresighting apparatus and method according to one or more embodiments of the disclosure further include an optical configuration that utilize light emitted by the target object in multiple wavelengths and simultaneously provide multiple collimated emitted light respectively in the detectable waveband of multiple imaging sensors of different types to advantageously permit simultaneous boresighting of multiple imaging sensors in an imaging system package. The term "light" as used herein is not limited to light in the visible spectrum, but should be understood as referring to electromagnetic radiation of any wavelength, whether visible or not, including for example infrared (IR) radiation, ultraviolet (UV) radiation, microwaves, radiofrequency (RF) waves, gamma rays, and X-rays.

Figure 1:
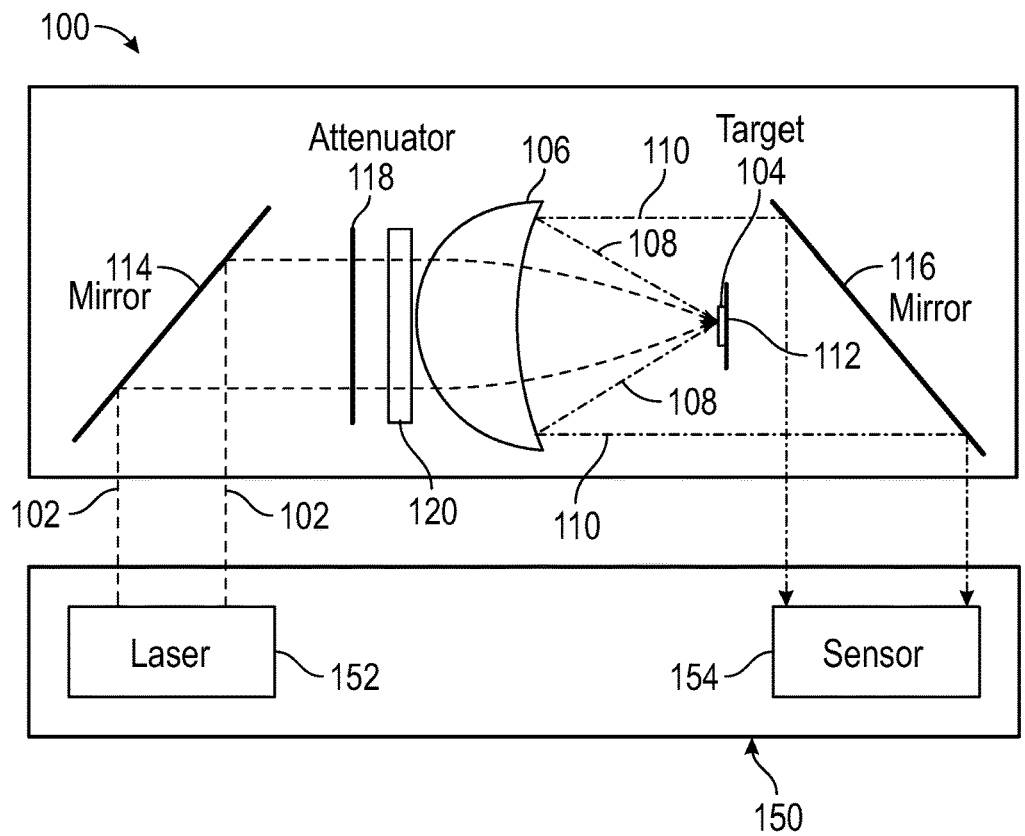
FIG. 1 illustrates an apparatus for boresighting a light source to an imaging sensor in an imaging system in accordance with an embodiment of the disclosure.

FIG. 1 illustrates a block diagram of an apparatus 100 for boresighting a light source 152 (e.g., a laser light source) to an imaging sensor 154 in an imaging system 150 in accordance with an embodiment of the disclosure. Imaging system 150 may represent any suitable imaging system, such as for example STAR SAFIRE® imaging systems from FLIR® SYSTEMS, INC. of Wilsonville, Oreg., having one or more imaging sensors and a light source for emitting a beam of light (e.g., a laser light) for pointing, rangefinding, target designation, or other uses, where the one or more imaging sensors and the light source are to be boresighted. Imaging system 150 may optionally include a gimbal for mounting to vehicles as desired for particular applications. Apparatus 100 for boresighting may also be referred to herein as a boresighting module 100.

In general, apparatus 100 for boresighting according to various embodiments may operate as follows. Apparatus 100 for boresighting takes a sample of a laser beam 102 emitted at wavelength $\lambda_P$ (e.g., beam of light including wavelength $\lambda_P$) from light source 152 and focuses laser beam 102 onto a spot on a target object 104 using a catadioptric element 106. Target object 104, in response to receiving the focused laser beam, emits light 108 having wavelength $\lambda_E$ that is detectable by imaging sensor 154. Wavelength $\lambda_E$ of the emitted light 108 is different (e.g., longer) than wavelength $\lambda_P$ of laser beam 102. Thus, even if wavelength $\lambda_P$ is not within the detectable waveband of imaging sensor 154, emitted light 108 having wavelength $\lambda_E$ that is injected into imaging sensor 154 can be detected and used for boresighting. Light 108 emitted from target object 104 is then collimated, also using catadioptric element 106, and injected into imaging sensor 154 for boresighting imaging sensor 154 to light source 152.

In this regard, catadioptric element 106 of apparatus 100 according to embodiments of the disclosure operates as a combination of both a refractive element that focuses laser beam 102 onto target object 104 and a reflective element that reflects emitted light 108 from target object 104 into a collimated emitted light 110. That is, catadioptric element 106 may be configured to transmit and focus light having a first wavelength (e.g., laser beam 102 emitted by light source 152 at wavelength $\lambda_P$) onto a location in its focal plane 112 while also being configured to reflect light having a second wavelength (e.g., light 108 having wavelength $\lambda_E$ emitted from target object 104).

Figure 2:
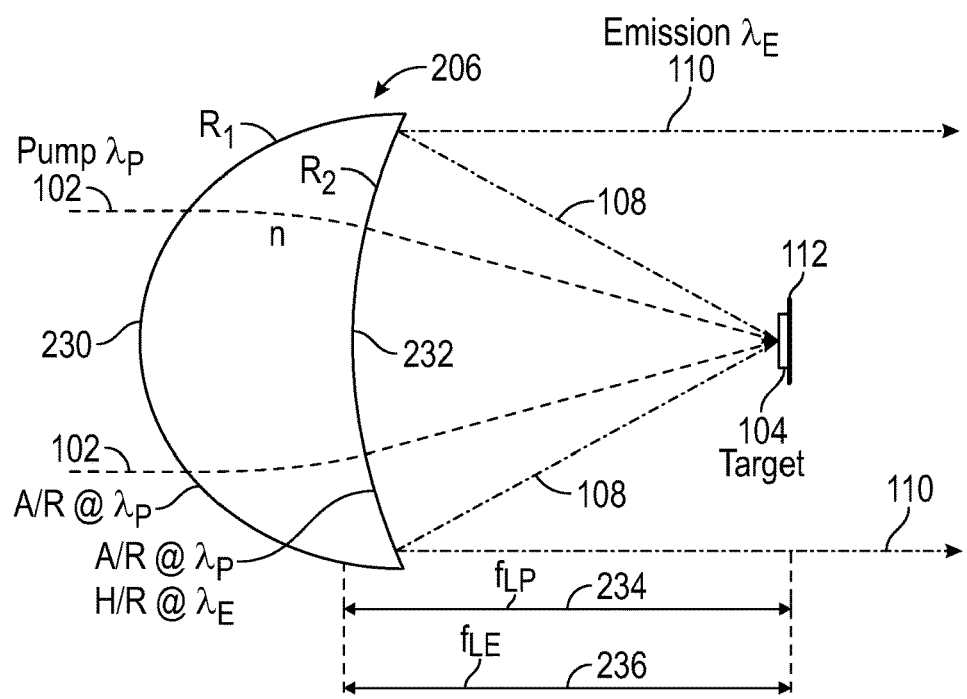
FIG. 2 illustrates a catadioptric element of the apparatus of FIG. 1 in accordance with an embodiment of the disclosure.

Further details of catadioptric element 106 may be understood with reference also to FIG. 2, which illustrates an example implementation of catadioptric element 106 in accordance with an embodiment of the disclosure. In the example implementation of FIG. 2, catadioptric element 106 is implemented using a positive meniscus lens 206 with an outer surface 230 having a first radius of curvature $R_1$ and an inner surface 232 having a second radius of curvature $R_2$ larger than the first radius of curvature $R_1$, such that laser beam 102 (also referred to as pump radiation) having wavelength $\lambda_P$ entering outer surface 230 and exiting inner surface 232 is focused at a focal length $f_{LP}$ 234 (e.g., back focal length) from positive meniscus lens 206.

As would be understood by one skilled in the art, a plane at focal length $f_{LP}$ 234 (e.g., effective focal length) from positive meniscus lens 206 that is perpendicular to an optical axis of positive meniscus lens 206 may define focal plane 112 associated with positive meniscus lens 206 where laser beam 102 is focused (e.g., if coinciding with the optical axis) or substantially focused (e.g., if not coinciding with the optical axis). Target object 104 onto which laser beam 102 is to be focused is thus positioned at focal plane 112 (e.g., to substantially coincide with focal plane 112) such that laser beam 102 is focused onto a spot on target object 104, the spot corresponding to the location of the focused laser beam 102 in focal plane 112.

As discussed above, target object 104 is configured to emit light 108 having $\lambda_E$ from the spot corresponding to the location of the focused laser beam 102 in focal plane 112, which is reflected and collimated by positive meniscus lens 206 also configured as a collimating mirror. More specifically, in some embodiments, inner surface 232 of positive meniscus lens 206 comprises a dichroic coating configured to transmit light having wavelength $\lambda_P$ of laser beam 102 and reflect light having wavelength $\lambda_E$ of the emitted light 108. In one example, a dielectric coating may be used as the dichroic coating configured to act as an anti-reflective (A/R) coating for light having wavelength $\lambda_P$ (indicated as "AIR @ $\lambda_P$" in FIG. 2) and as a reflective (H/R) coating for light having wavelength $\lambda_E$ (indicated as "H/R @ $\lambda_E$" in FIG. 2). In some embodiments, outer surface 230 of positive meniscus lens 206 may be also be A/R coated for light having wavelength $\lambda_P$ to minimize reflection of laser beam 102 entering outer surface 230.

Inner surface 232 of positive meniscus lens 206, which thus appears as a mirror to the emitted light 108 due to the dichroic coating, reflects the emitted light 108 and sends it forward as the collimated emitted light 110 to imaging sensor 154 to which boresighting is to be accomplished. In order for light 108 emitted from a spot on target object 104 to be reflected into the collimated emitted light 110, the position of target object 104 is also at (e.g., coincides with) a focal plane associated with the dichroic collimating mirror implemented by inner surface 232. That is, focal length $f_{LE}$ 236 associated with the dichroic collimating mirror implemented by inner surface 232 is set such that it is substantially same as focal length $f_{LP}$ 234 with respect to the focused laser beam 102.

Focal length $f_{LP}$ 234 with respect to the focused laser beam 102 may be determined at least in part by the radius of curvature $R_1$ of outer surface 230, the radius of curvature $R_2$ of inner surface 232, and the refractive index n of positive meniscus lens 206, and focal length $f_{LE}$ 236 associated with the collimating mirror may be determined at least in part by the radius of curvature $R_2$ of inner surface 232, for example. Consequently, according to one or more embodiments, the radius of curvature $R_1$ of outer surface 230, the radius of curvature $R_2$ of inner surface 232, and the refractive index n of the material of positive meniscus lens 206 may be chosen to provide a focal length with respect to the focused laser beam that is substantially same as a focal length of the collimating mirror.

As an example illustrated with thin-lens expressions for sake of clarity and simplicity, $f_{LP}=f_{LE}$ when $$R_2 = R_1 \frac{(n+1)}{(n-1)},$$

and thus $$f_{LP} = f_{LE} = \frac{R_1}{2} \frac{(n+1)}{(n-1)},$$

since $$f_{LP} = \frac{1}{(n-1)}\left(\frac{R_1 R_2}{R_2 - R_1}\right) \text{ and } f_{LE} = \frac{R_2}{2}.$$

Thus, for a given lens material with the refractive index n, the radius of curvature $R_1$ of outer surface 230, the radius of curvature $R_2$ of inner surface 232 may be chosen according to these example equations to provide a focal length $f_{LP}$ with respect to the focused laser beam that is substantially same as a focal length $f_{LE}$ of the collimating mirror. Although thin-lens expressions were used in the non-limiting example above, one skilled in the art would be able to determine the radius of curvature $R_1$ of outer surface 230 and the radius of curvature $R_2$ of inner surface 232 to provide focal lengths $f_{LE}$ and $f_{LP}$ that are substantially same, using thick-lens expressions and/or other optical analysis methods based on the principles of positive meniscus lens 206 disclosed herein for various embodiments.

Referring again to FIG. 1, apparatus 100 for boresighting in some embodiments may include an input mirror 114 to deflect laser beam 102 into apparatus 100 from light source 152 and an output mirror 116 to deflect the collimated emitted light 110 out of apparatus 100 to imaging sensor 154. For example, input mirror 114 may be positioned to receive laser beam 102 from light source 152 and direct laser beam 102 toward catadioptric element 106 (e.g., positive meniscus mirror 206), and output mirror 116 may be positioned to receive the collimated emitted light 110 from catadioptric element 106 and direct the collimated emitted light 110 toward imaging sensor 154. In other embodiments, a plurality of mirrors may be utilized at the input side (e.g., in an optical path prior to catadioptric element 106) to deflect laser beam 102 into apparatus 100 from light source 152 while no deflection is provided at the output side (e.g., in an optical after catadioptric element 106), or a plurality of mirrors may be utilized at the output to deflect the collimated emitted light 110 to imaging sensor 154 while no deflection is provided at the input side, or any other suitable combination of mirror arrangements may be provided at the input and the output sides.

The collimated emitted light 110 is thus injected (e.g., via output mirror 116 in some embodiments) into imaging sensor 154 of imaging system 150 for use in boresighting light source 152, and hence laser beam 102 emitted from it, to imaging sensor 154. With imaging sensor 154 set to infinity focus as part of a boresighting process, the collimated emitted light 110 focuses down to a spot at imaging sensor 154 corresponding to the location of laser beam 102 focused on target object 104. The location of the spot on imaging sensor 154, relative to a reticle associated with imaging sensor 154 (e.g., a reticle overlaid or otherwise displayed on images captured by imaging sensor 154 for display by imaging system 150), provides an indication of any shift in the angle of laser beam 102 emitted by light source 152 relative to imaging sensor 154. Consequently, the boresighting process may apply appropriate correction based on such an indication of shift or misalignment. For example, the boresighting process may reposition the reticle (e.g., by electronically assigning a new pixel coordinate for the reticle) to place it over the indicated spot, so that the location of the focused laser beam 102 coincides with the reticle associated with imaging sensor 154.

In some embodiments, apparatus 100 for boresighting may include an attenuator 118 disposed in the optical path of laser beam 102 before catadioptric element 106 and configured to reduce the intensity of laser beam 102 focused on target object 104. For example, attenuator 118 may comprise an optical filter, such as a neutral-density (ND) filter, that can reduce the intensity of laser beam 102 passing through. In some embodiments, apparatus 100 for boresighting may include a beam steerer 120, such as risely prisms or other wedge prisms, disposed in the optical path of laser beam 102 before catadioptric element 106 and configured to provide alignment adjustments of laser beam 102 to catadioptric element 106.

As illustrated above with reference to FIGS. 1 and 2, embodiments of apparatus 100 for use in boresighting light source 152 emitting laser beam 102 at wavelength to imaging sensor 154 having a detectable waveband including wavelength $\lambda_E$ include catadioptric element 106, such as positive meniscus lens 206, that is configured as a combination of both a refractive and reflective element to focus the incoming laser beam 102 and collimate the emitted light 108 for use in boresighting. Therefore, for example, embodiments of apparatus 100 advantageously provide a compact optical arrangement that can permit a reduction in the size, weight, and complexity of apparatus 100. In this regard, in some embodiments, apparatus 100 may be sufficiently compact and light that it is integrated with imaging system 150 to be boresighted. For example, in some embodiments, apparatus 100 may be implemented as a boresighting module that is internal to imaging system 150 or externally attached to imaging system 150, and configured to move (e.g., rotate) in and out of the optical paths of light source 152 and imaging sensor 154 for on-the-fly boresighting as needed.

In various examples of imaging system 150, imaging sensor 154 may comprise an infrared imaging sensor, such as a short-wave infrared (SWIR) imaging sensor generally having a detectable waveband within a range of approximately 0.8 to 3 micrometers (or more specifically 1.4 to 3 micrometers or 0.8 to 1.7 micrometers in some examples) a mid-wave infrared (MWIR) imaging sensor generally having a detectable waveband within a range of approximately 3 to 8 micrometers (or more specifically 3 to 5 micrometers in some examples), or a long-wave infrared (LWIR) imaging sensor having a detectable waveband within a range of approximately 8 to 15 micrometers. Furthermore, light source 152 of imaging system 150 may be configured to emit laser beam 102 at wavelength $\lambda_P$ that is not detectable (e.g., wavelength $\lambda_P$ is outside the detectable waveband of the infrared imaging sensor) or not substantially detectable (e.g., infrared imaging sensor is not sufficiently sensitive for boresighting purposes at wavelength $\lambda_P$, such as when wavelength $\lambda_P$ is only marginally within the detectable waveband or in the lower bound region of the detectable waveband). For example, light source 152 may be a laser source having an operating wavelength at approximately between 600 nanometers (0.6 micrometers) and 1100 nanometers (1.1 micrometers), thus laser beam 102 from such a laser source would be outside the detectable waveband of a MWIR or LWIR sensor and would not be detectable or substantially detectable by a SWIR sensor. As may be appreciated, the unit "micrometers" may also be indicated as "µm" or "microns."

As non-limiting examples according to embodiments of the disclosure, light source 152 of imaging system 150 to be boresighted using apparatus 100 may include a Nd:YAG laser having an operating wavelength of 1.064 micrometers, a Yb:YAG laser having an operating wavelength of 1.03 micrometers, a ruby laser having an operating wavelength of 0.6943 micrometers, a NdCr:YAG laser having an operating wavelength of 1.064 micrometers, a VCSEL laser having an operating wavelength in the 0.85 to 1.5 micrometer range, a Ti:Sapphire laser having an operating wavelength in the 0.65 to 1.1 micrometer range, or any other laser source configured to emit laser beam 102 at a wavelength not detectable or substantially detectable by a LWIR, MWIR, and/or SWIR imaging sensor. In some specific examples of imaging system 150, light source 152 may be a Nd:YAG or Yb:YAG laser source, which are often found in surveillance and military imaging systems, and imaging sensor 154 may include a MWIR imaging sensor, a combination of MWIR and visible light-near infrared (Vis-NIR) imaging sensors (e.g., a Vis-NIR imaging sensor having a detectable waveband within a range of approximately 0.3 to 1 micrometers), a combination of SWIR and MWIR imaging sensors, or a combination of SWIR, MWIR, and Vis-NIR imaging sensors.

Given such operating wavelength of light source 152 and detectable wavebands of imaging sensor 154, target object 104 may be configured to emit light 108 having wavelength $\lambda_E$ that within the detectable waveband of SWIR, MWIR, or LWIR imaging sensors in response to receiving the focused laser beam 102 emitted by a laser source at wavelength $\lambda_P$, according to one or more embodiments of the disclosure. In some embodiments, to permit simultaneous boresighting of multiple imaging sensors of different types provided in some example imaging systems, target object 104 may be configured to emit light 108 having at least two wavelengths $\lambda_{E1}$ and $\lambda_{E2}$, each within the detectable waveband of at least one of the imaging sensors provided in the imaging system. In addition, to permit simultaneous boresighting of multiple imaging sensors of different types, an apparatus for use in boresighting according to some embodiments of the disclosure may also include one or more optical elements to direct collimated emitted light having at least two wavelengths each toward a corresponding imaging sensor to be detected for boresighting. For non-limiting illustration of such embodiments for use in simultaneous boresighting of multiple imaging sensors to a light source in an imaging system, reference is made to FIGS. 3 through 6 which show block diagrams of apparatuses 300, 400, 500, 600, and 600 for use in simultaneous boresighting of multiple imaging sensors in accordance with various embodiments of the disclosure.

Figure 3:
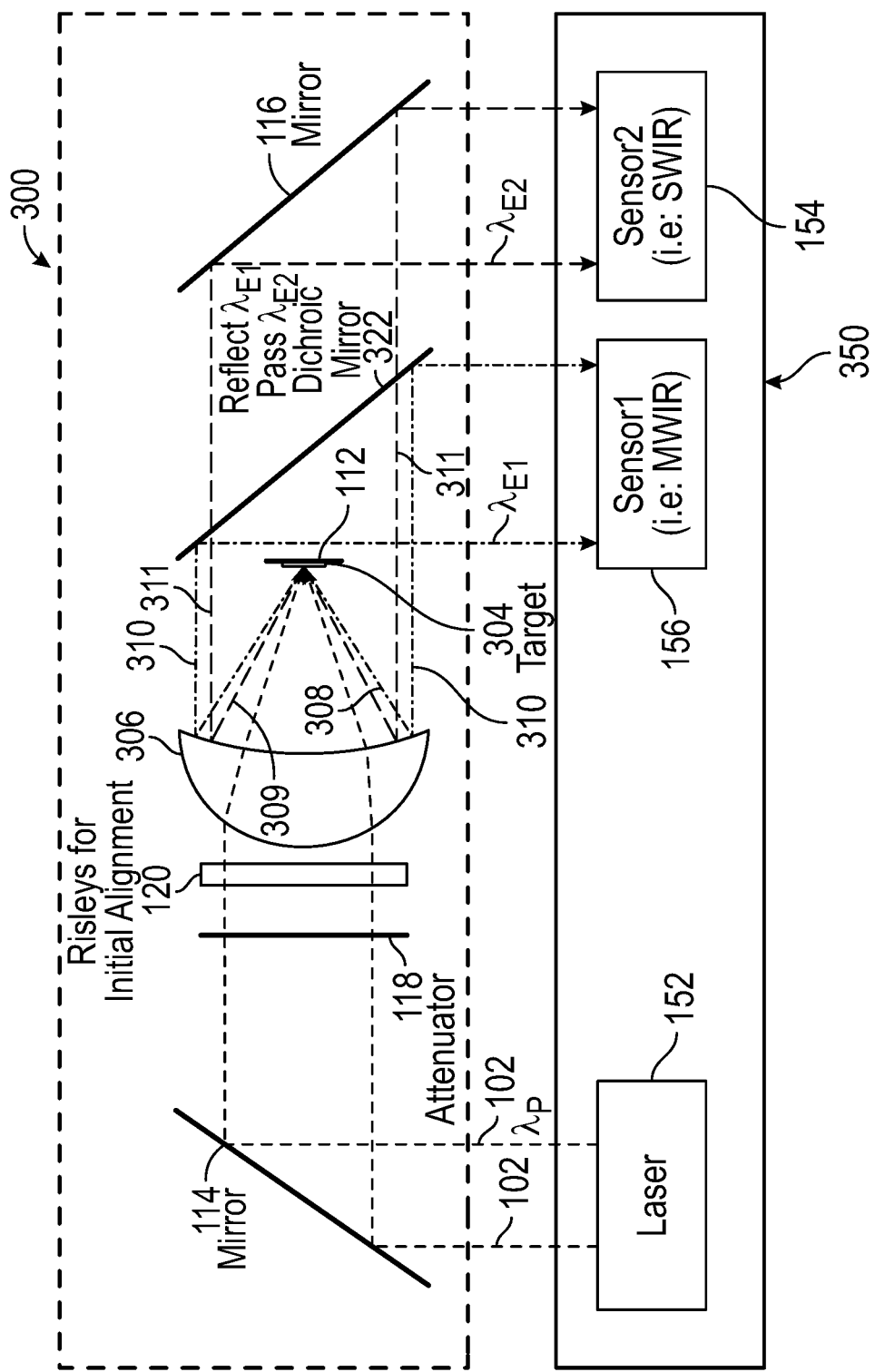
FIG. 3 illustrates an apparatus for boresighting a light source to multiple imaging sensors in an imaging system in accordance with an embodiment of the disclosure.

In FIG. 3, an imaging system 350 further comprises an additional imaging sensor 156, and apparatus 300 for simultaneous boresighting of imaging sensors 154 and 156 to light source 152 further comprises a dichroic mirror 322 disposed between a catadioptric element 306 and output mirror 116 in accordance with an embodiment of the disclosure. In one specific example, imaging sensor 154 may be a SWIR imaging sensor having a detectable waveband within a range of approximately 0.8 to 1.7 micrometers, and imaging sensor 156 may be a MWIR imaging sensor having a detectable waveband within a range of approximately 3 to 5 micrometers.

As discussed above, a target object 304 in apparatus 300 is configured to emit light 308 having wavelength $\lambda_{E1}$ and light 309 having wavelength $\lambda_{E2}$ (corresponding to wavelength $\lambda_E$ in FIGS. 1 and 2), where wavelength $\lambda_{E1}$ is within the detectable waveband of imaging sensor 156 and wavelength $\lambda_{E2}$ is within the detectable waveband of imaging sensor 154. Catadioptric element 306 (e.g., a positive meniscus lens) is similar to catadioptric element 106 (e.g., positive meniscus lens 206), but may be configured to reflect both the emitted light 308 having wavelength $\lambda_{E1}$ and the emitted light 309 having wavelength $\lambda_{E2}$ into collimated emitted light 310 and 311, respectively. Dichroic mirror 322, which for example comprises a dichroic coating, is configured to selectively reflect collimated emitted light 310 having wavelength $\lambda_{E1}$ toward imaging sensor 156 and selectively pass collimated emitted light 311 having wavelength $\lambda_{E2}$ (e.g., to output mirror 116). In this way, both imaging sensors 154 and 156 are injected (e.g., irradiated) simultaneously with collimated emitted light 311 and 310 respectively within the detectable wavebands of imaging sensors 154 and 156, and both can therefore be boresighted to light source 152.

It should be understood that the order of imaging sensors 154 and 156 in FIG. 3 is given only as a non-limiting example and can be reconfigured with a suitable modification of the wavelength response of dichroic mirror 322. It should also be understood that the orientation of imaging sensors 154 and 156 relative to apparatus 300 is given only as a non-limiting example. As discussed above in connection with input and output mirrors 114 and 116 of FIG. 1, an appropriate combination of input and output mirrors and optics can be utilized to accommodate different light source and imaging sensor orientations and layouts (e.g., all to the left or right of apparatus 300 in FIG. 3). It is also contemplated that embodiments illustrated with reference to FIG. 3 may be modified to provide an apparatus for simultaneous boresighting of different numbers and combination of imaging sensors than those illustrated in FIG. 3, based on the principles and techniques discussed above with reference to FIGS. 1-3. For example, the spirit and scope of the present disclosure covers an embodiment for boresighting three or more imaging sensors as desired for particular applications.

Figure 4:
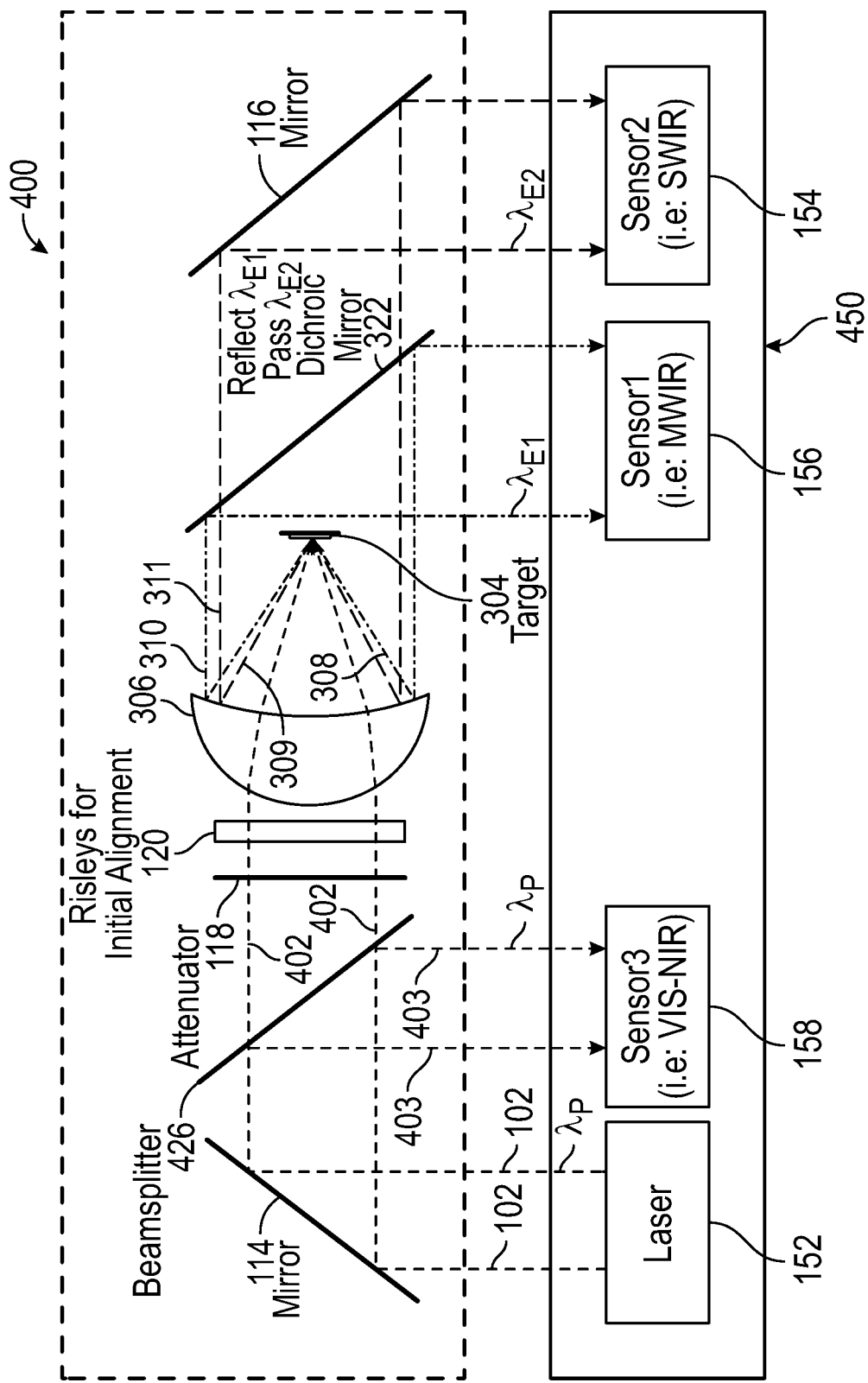
FIG. 4 illustrates an apparatus for boresighting a light source to multiple imaging sensors in an imaging system in accordance with another embodiment of the disclosure.

In FIG. 4, an imaging system 450 further comprises yet another imaging sensor 158 having a detectable waveband that includes wavelength $\lambda_P$ of laser beam 102, and apparatus 400 is configured for use in simultaneous boresighting of imaging sensors 154, 156, and 158 to light source 152 in accordance with another embodiment of the disclosure. In one specific example, imaging sensor 154 may be a SWIR imaging sensor having a detectable waveband within a range of approximately 0.8 to 1.7 micrometers, imaging sensor 156 may be a MWIR imaging sensor having a detectable waveband within a range of approximately 3 to 5 micrometers, and imaging sensor 158 may be a Vis-NIR imaging sensor having a detectable waveband within a range of approximately 0.3 to 0.8 micrometers.

Here, since imaging sensor 158 is sensitive to wavelength $\lambda_P$ of laser beam 102 directly, there is essentially no need to focus, reflect, and recollimate laser beam 102 having wavelength $\lambda_P$ for injection into imaging sensor 158. Thus, apparatus 400 according to embodiments of the disclosure may advantageously take a direct sample of laser beam 102 and send the sample toward imaging sensor 158 using a beamsplitter 426, prior to focusing and collimation by catadioptric element 306, In this regard, beamsplitter 426 may be disposed in an optical path prior to catadioptric element 306 (e.g., between input mirror 114 and catadioptric element 306) and configured to split laser beam 102 into a first laser beam 402 directed toward catadioptric element 306 and a second laser beam 403 directed toward imaging sensor 158. Beamsplitter 426 may, for example, be implemented using prisms, a half-mirror, a mirrored prism assembly, or other suitable optical elements. Although FIG. 4 illustrates apparatus 400 configured for boresighting three imaging sensors 154, 156, and 158, it should be appreciated that apparatus 400 may be modified according to the principles of the disclosure for use in boresighting any other number of imaging sensors (e.g., two imaging sensors 154 and 158), including common-optics multiple imaging sensor packages (e.g., as illustrate in FIG. 6 below).

Figure 5:
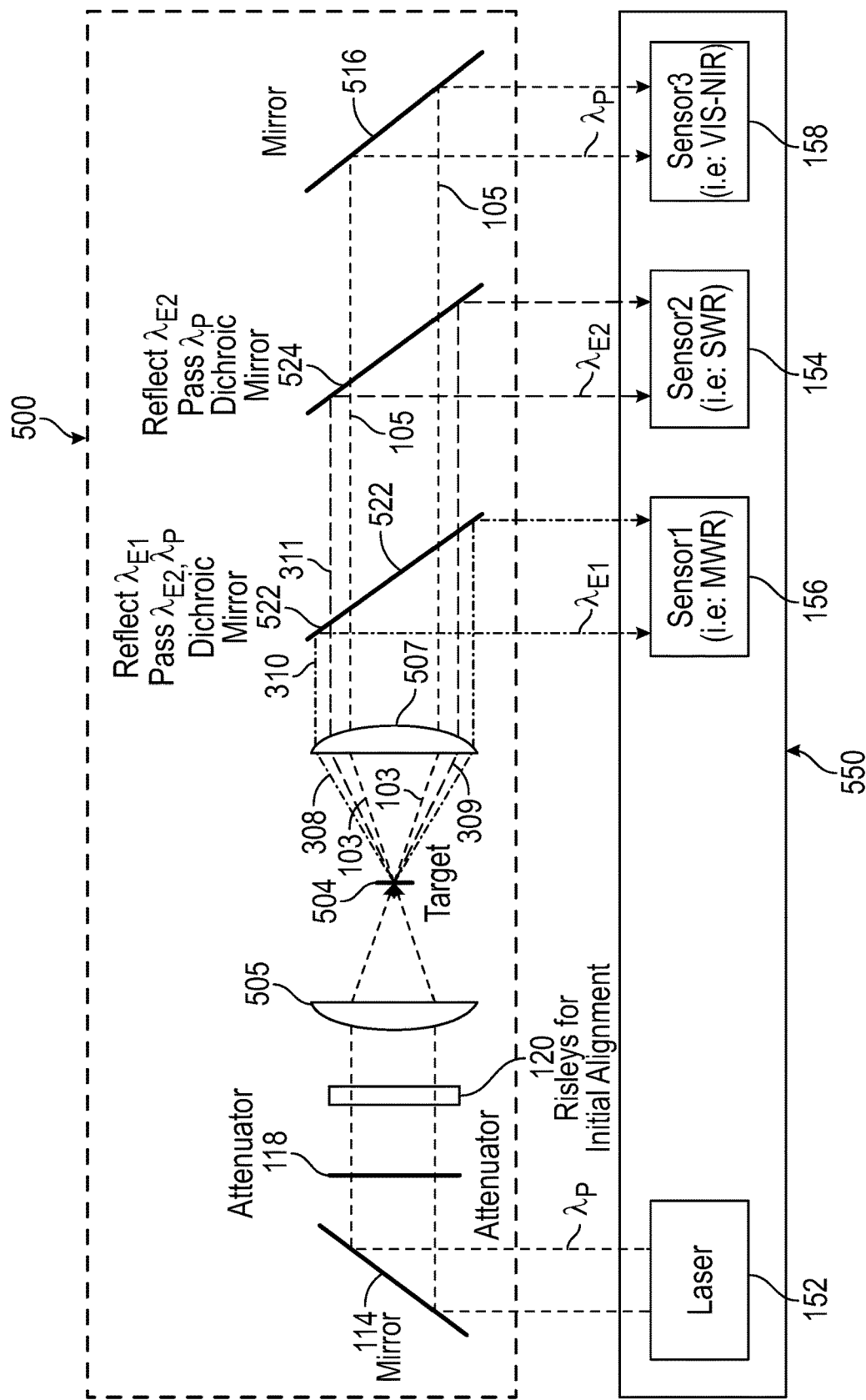
FIG. 5 illustrates an apparatus for boresighting a light source to multiple imaging sensors in an imaging system in accordance with another embodiment of the disclosure.

FIG. 5 illustrates an apparatus 500 for use in simultaneous boresighting of imaging sensors 154, 156, and 158 to light source 152 in an imaging system 550 in accordance with another embodiment of the disclosure. A target object 504 of apparatus 500 is similar to target object 304, but is further configured to pass and/or reflect a portion of the focused laser beam 102 as a residual laser beam 103 to be recovered (e.g., extracted), for example, through the rear of target object 504 along with the emitted light 308 and 309. In apparatus 500, focusing of laser beam 102 onto target object 504 is performed by a focusing lens 505, and collimation of the emitted light 308 and 309 and recollimation of residual laser beam 103 into recollimated residual laser beam 105 are performed by a collimating lens 507 for a "through-target" approach of focusing and collimation, instead of using catadioptric element 106, 206, or 306. Collimated emitted light 310 and 311 and recollimated residual laser beam 105 are then directed to respective corresponding imaging sensors 156, 154, and 158 by dichroic mirrors 522 and 524 and output mirror 516.

More specifically, dichroic mirror 522 is configured to selectively reflect collimated emitted light 310 having wavelength $\lambda_{E1}$ toward imaging sensor 156 similar to dichroic mirror 322, but is also configured to selectively pass both collimated emitted light 311 having wavelength $\lambda_{E2}$ and recollimated residual laser beam 105 having wavelengths $\lambda_P$ (e.g., to dichroic mirror 524). Dichroic mirror 524, in turn, is configured to selectively reflect collimated emitted light 311 having wavelength $\lambda_{E2}$ toward imaging sensor 154 and selectively pass recollimated residual laser beam 105 having wavelength $\lambda_P$ (e.g., to output mirror 516). Output mirror 516 is similar to output mirror 116 but is configured to direct received light (e.g., recollimated residual laser beam 105) toward imaging sensor 158 instead of imaging sensor 154. In this way, all three imaging sensors 154, 156, and 158, including imaging sensor 158 that can detect wavelength $\lambda_P$ without converting to another wavelength by target object 504, can be simultaneously boresighted to light source 152. Although FIG. 5 illustrates apparatus 500 configured for boresighting three imaging sensors 154, 156, and 158, it should be appreciated that apparatus 500 may be modified according to the principles of the disclosure for use in boresighting any other number of imaging sensors (e.g., two imaging sensors 154 and 158), including common-optics multiple imaging sensor packages (e.g., as illustrate in FIG. 6 below).

Figure 6:
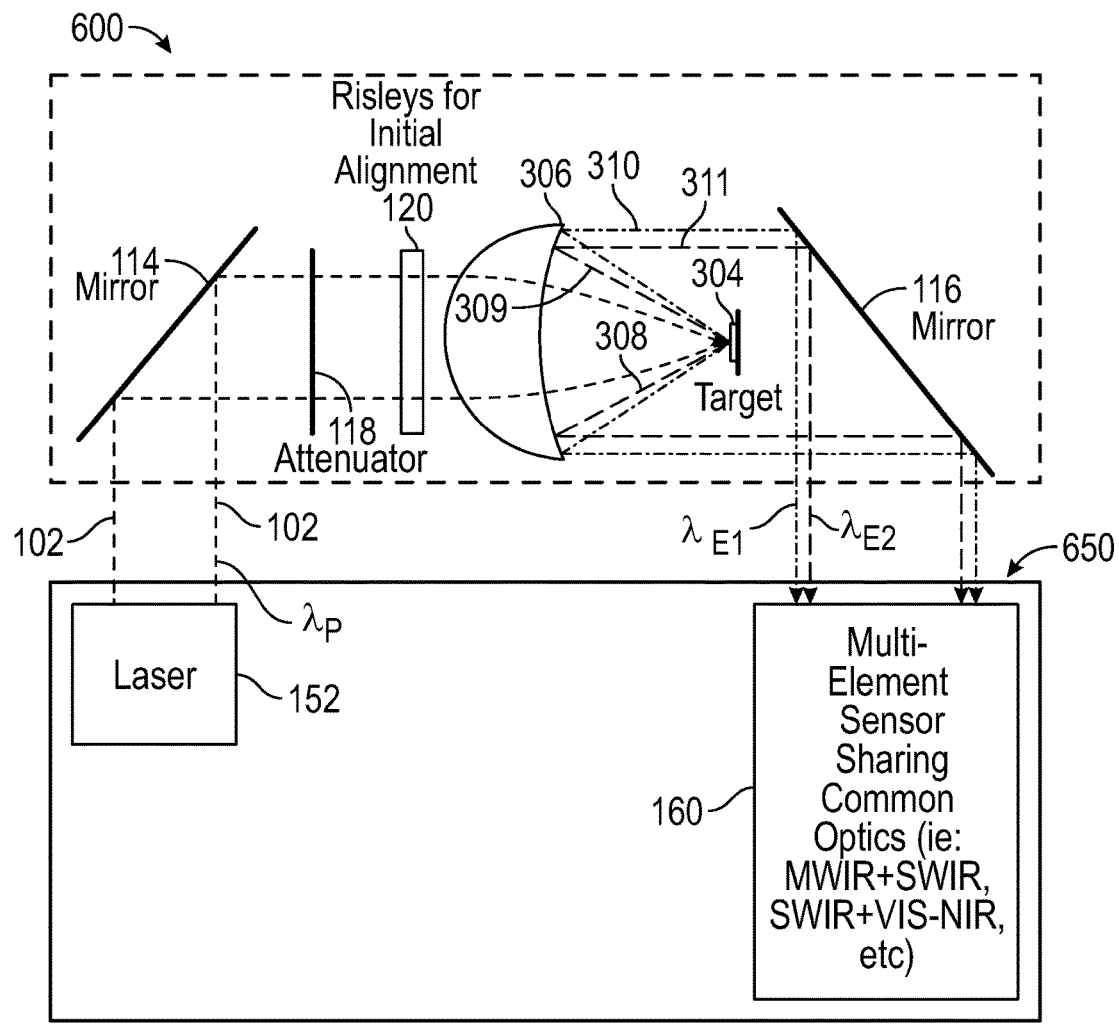
FIG. 6 illustrates an apparatus for boresighting a light source to a common-optics multiple imaging sensors package in an imaging system in accordance with an embodiment of the disclosure.

In some implementation examples, an imaging system to be boresighted may include multiple imaging sensors that do not have their own individual input optics, but that share a common set of input optics. These input optics are designed to cover all of the detectable wavebands associated with the multiple imaging sensors. Optical elements behind the common optics are used to separate out the individual wavebands that the individual imaging sensors are responsive to, and direct the appropriate radiation to its corresponding sensor. FIG. 6 illustrates an apparatus 600 for use in boresighting a common-optics multiple imaging sensor package 160 in such an imaging system 650 in accordance with an embodiment of the disclosure. In the example illustrate in FIG. 6, common-optics multiple imaging sensor package 160 is a two-sensor package 160. Apparatus 600 includes target object 304 and catadioptric element 306 to focus laser beam 102 and provide collimated emitted light 310 and 311 similar to apparatus 300. However, for apparatus 600, there is no need for spatial separation of the individual wavebands using dichroic mirrors (such as dichroic mirrors 322, 522, and 524 in FIGS. 3 and 5), as that function is performed within common-optics multiple imaging sensor package 160. Although FIG. 6 shows a two-sensor package 160 in imaging system 650 and apparatus 600 configured for boresighting the two-sensor package 160 as a non-limiting example, it should be appreciated that apparatus 600 may be modified according to the principles of the disclosure for use in boresighting any other number of imaging sensor in a common-optics multiple imaging sensor package (e.g., a three-sensor package).

Apparatuses 300, 400, 500, and 600 discussed above with reference to FIGS. 3 through 6 according to various embodiments therefore include optical configurations that advantageously permit simultaneous boresighting of multiple imaging sensors of different types, without having to repeat a boresighting procedure for each of the multiple imaging sensors of an imaging system.

As discussed above, apparatus 100, 300, 400, 500, or 600 according to various embodiments may be configured to move in and out (e.g., rotate in and out) of optical paths of laser beam 102 and imaging sensors 154, 156, and/or 158 so that laser beam 102 is received by apparatus 100, 300, 400, 500, or 600 and collimated radiation (e.g., collimated emitted light 110, 310, and/or 311 and recollimated reflected laser beam 105) is injected into imaging sensors 154, 156, and/or 158 as needed to perform boresighting. However, this may introduce unavoidable minor angular tilts of apparatus 100, 300, 400, 500, or 600 relative to imaging system 150, 350, 450, 550, or 650 when apparatus 100, 300, 400, 500, or 600 is in position for boresighting imaging system 150, 350, 450, 550, or 650. Thus, some embodiments of the disclosure include additional optical elements configured to make boresighting insensitive to such minor angular tilts.

Figure 7:
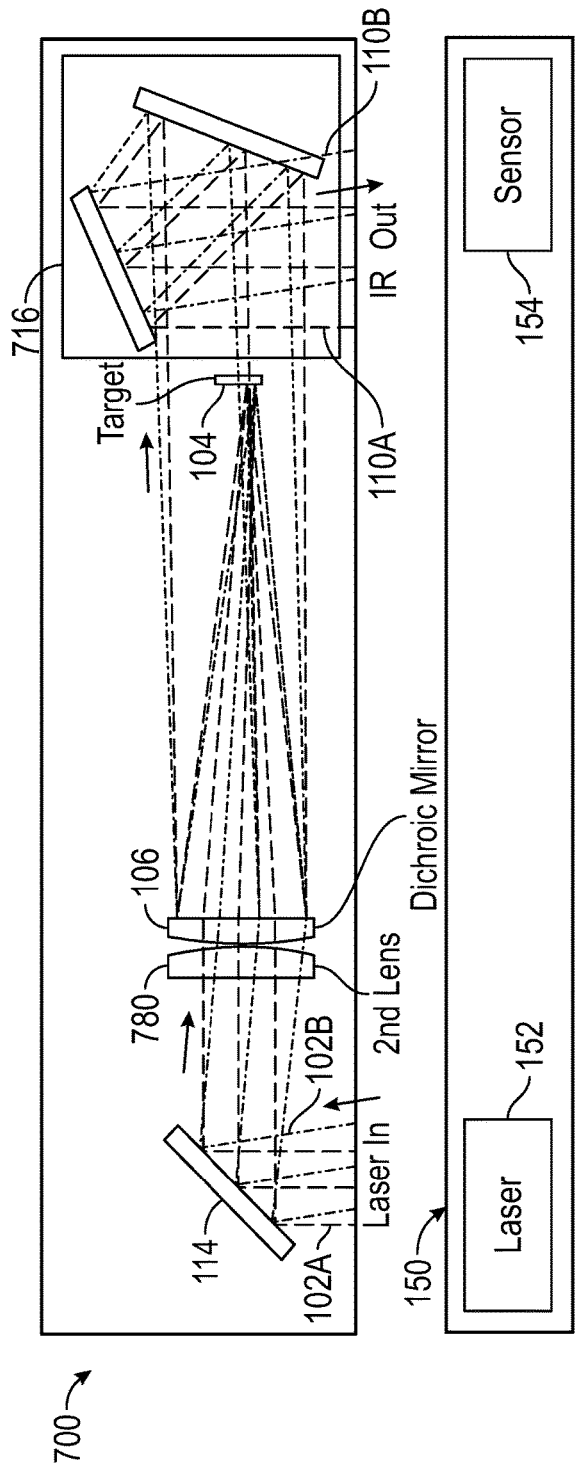
FIG. 7 illustrates an apparatus for boresighting a light source to an imaging sensor in an imaging system and having one or more optical elements configured to compensate for angular tilts of the apparatus relative to its intended orientation with respect the imaging system in accordance with an embodiment of the disclosure.

FIG. 7 illustrates an apparatus 700 having one or more optical elements configured to compensate for angular tilts of apparatus 700 relative to its intended orientation with respect to imaging system 150 in accordance with an embodiment of the disclosure. In one aspect, apparatus 700 includes one or more lenses 780 disposed in an optical path of a laser beam 102A or 102B prior to catadioptric element 106 (e.g., between input mirror 114 and catadioptric element 106) and configured to compensate for angular magnification introduced by catadioptric element 106. Unlike a "thin lens" of the simple formulas, a lens of finite thickness such as catadioptric element 106 (e.g., positive meniscus lens 206) can slightly change the beam size between input and output for the same convergence cone angle of the two beams at the target. By a fundamental optical invariant, the angular magnification of the output beam angle relative to the input beam angle must then differ from (−)1, disturbing by the same factor the boresight angles when apparatus 700 tilts slightly relative to its intended orientation with respect to imaging system 150. By including one or more lenses 780, this angular magnification can be returned to unity while maintaining the focal points coincident. Conventional boresighting module designs generally use common optical paths in the focusing elements and do not suffer from this error or otherwise are not as sensitive to such small differences in angles.

In another aspect, an input or output mirror of apparatus 700 may include a fold mirror arrangement configured to compensate for tilting of apparatus 700 relative to imaging system 150 by making laser beam 102A (or laser beam 102B with tilt introduced) to imaging system 150 and collimated emitted light 110A (or collimated emitted light 110B with tilt introduced) substantially parallel to each other. Directions of laser beams and collimated emitted light are shown exaggerated with arrows in FIG. 7 for ease of understanding. In the example of FIG. 7, an output mirror 716 comprises a fold mirror arrangement with an extra fold, but in other examples input mirror 114 may alternatively comprise a fold mirror arrangement. With a fold mirror arrangement at either the input or output mirror, tilting apparatus 700 (including the mirrors) moves the input focal point at target object 104 in the same direction as the output focal point (for an output beam parallel to the input beam). As specific examples, the fold mirror arrangement may be implemented using a pentamirror, or prisms, such as a pentaprism.

Thus, apparatus 700 can tilt in any axis, over the necessary small angles of practical mechanical mounting schemes, without disturbing the extremely tight relation between input and output beams fundamental to proper operation of apparatus 700 for boresighting. Conventional boresighting module designs typically require equal numbers of mirror reflections in the two paths, or numbers which differ by two (or even numbers) if one or more periscopes (e.g., a rhomboid prism below) are included. As may be appreciated, although apparatus 700 is illustrated relative to apparatus 100 and imaging system 150 of FIG. 1, appropriate modifications can be made to provide an apparatus compensate for angular tilts in boresighting imaging systems 150, 350, 450, 550, or 650 by including one or more lenses such as one or more lenses 780 and/or a fold mirror such as output mirror 716 in apparatus 300, 400, 500, or 600.

Referring again to target objects 104, 304, and 504 of FIGS. 1 through 7, these target objects are configured to emit light at one or more wavelengths (e.g., wavelengths $\lambda_{E1}$ and $\lambda_{E2}$ associated with emitted light 308 and 309) in response to being irradiated by light having a particular wavelength or wavelength region (e.g., wavelength $\lambda_P$ of laser beam 102) as discussed above. Various embodiments of the disclosure provide target object 104, 304, or 504 implemented using various different materials suitable for such emission in response to irradiation.

In some embodiments, target object 104, 304, or 504 may comprise (e.g., be implemented using) thermal absorbers. For example, germanium is a good absorber of some operating wavelengths of a laser source (e.g., 1.064 micrometer characteristic wavelength of a Nd:YAG laser source), and can be heated to emit sufficient infrared radiation, for example, in the MWIR waveband. Germanium also exhibits good thermal conductivity suitable for a "through-target" approach illustrate above with reference to FIG. 6, and can be made into a thin disc suitable for a target object. Other thermal absorber materials may include, for example, aluminum nitride (AlN), silicon carbide (SiC), graphite/graphene, and aluminum oxide ($Al_2O_3$).

In some embodiments, target object 104, 304, or 504 may comprise (e.g., be implemented using) quantum dots. These materials can be engineered to emit a fluorescence signal whose emission wavelength can be tuned to a particular value, based on the diameter of the quantum dot. Some embodiments of the disclosure include an appropriate mixture of two or more quantum dot materials to provide for multi-wavelength emission compatible with multi-sensor boresighting requirements.

In some embodiments, target object 104, 304, or 504 may comprise (e.g., be implemented using) a non-linear optical (NLO) material. Generally, a non-linear optical material, when irradiated in a proper fashion by one or more particular wavelengths, can re-emit two wavelengths, typically at longer wavelengths than the irradiation wavelength, in a fashion that is different than fluorescence. In one specific implementation, for example, the non-linear optical material may include Potassium Titanyl Phosphate (KTP). This material has the property that, when irradiated at the 1.064 um wavelength (e.g., characteristic wavelength of a Nd:YAG laser source) under suitable condition, can generate both 1.57 um radiation (termed the 'signal' wavelength) and 3.3 um radiation (termed the 'idler' wavelength). These two wavelengths are compatible with SWIR and MWIR imaging sensors, respectively.

In some embodiments, target object 104, 304, or 504 may comprise (e.g., be implemented using) a fluorescent material. In general, a fluorescent material can be pumped/excited when irradiated by a particular wavelength or wavelengths, and subsequently re-emits radiation in one or more different wavelengths by atomic electron transition. Examples of a fluorescent material in one or more embodiments may include, Er:YAG, erbium aluminum garnet (ErAG), Yb,Er:GSGG, and rare earth ions (e.g., $Dy^{3+}$, $Ho^{3+}$, $Er^{3+}$, $Pr^{3+}$, $Nd^{3+}$) doped in chalcogenide glass.

In some specific implementations according to one or more embodiments, for example, the fluorescent material may be a novel garnet material co-doped with $Cr^{4+}$ ions and $Er^{3+}$ ions, in other words a $Cr^{4+},Er^{3+}$:YAG material. This novel material has the property that when irradiated at the 1.064 um or 1.030 urn wavelengths (e.g., characteristic wavelength of a Nd:YAG and Yb:YAG laser sources respectively), generates radiation at both the 1.5-micron region (e.g., 1.3 to 1.6 microns) and at the 3-micron region (e.g., 2.7 to 2.9 microns). These two wavelength bands are compatible with SWIR and MWIR sensors, respectively. The novel doped garnet material in accordance with various embodiments disclosed herein is not limited to implementing target object 104, 304, or 504, but rather has a broad variety of applications across military, commercial, industrial, and scientific fields, such as for example wide-bandgap semiconductor pumped LED's, lasers, x-ray detection, laser alignment, and other applications that require wavelength conversion. Details of this novel doped garnet material are further described below.

In the novel $Cr^{4+},Er^{3+}$:YAG material, optically active $Cr^{4+}$ ions and $Er^{3+}$ ions are incorporated in to a garnet host lattice resulting in broad absorption in the 1-micron regions (e.g., within a NIR waveband) that can be pumped/excited using a laser resulting in subsequent emission in both the 1.5-micron region (e.g., within a SWIR waveband) and 3-micron region (e.g., within a MWIR waveband). $Er^{3+}$ ions in garnet host materials exhibit emission near 3.0-microns via the $^4I_{11/2}$-$^4I_{13/2}$ fluorescent transition. However, $Er^{3+}$ does not absorb light in the 1-micron wavelength region where many IR lasers sources (e.g., a Nd:YAG laser source, a Yb:YAG laser source, and other laser sources discussed above) emit. The addition of $Cr^{4+}$ to the $Er^{3+}$:Garnet system enables absorption of 1-micron laser energy, with subsequent emission in the both the 1.5-micron and 3-micron regions. According to embodiments of the disclosure, the Cr4+ and Er3+ concentrations are varied to achieve a desired relative strength of the 1.5-micron and 3-micron emissions.

In general, the fluorescent optical material according to embodiments of the disclosure may be described as

$$Cr^{4+},AE^{2+},Er^{3+}:C_3A_2D_3O_{12}, \quad \text{(Formula 1)}$$

where $C_3A_2D_3O_{12}$ describes a generic oxygen-coordinated garnet host structure where:

C represents tri-valent host cations occupying the dodecahedral garnet site, including $Y^{3+}$, $Lu^{3+}$, $Gd^{3+}$;

A represents tri-valent host cations occupying the octahedral garnet site, including $Al^{3+}$, $Ga^{3+}$, $Sc^{3+}$;

D represents tri-valent host cations occupying the tetrahedral garnet site including $Al^{3+}$ and $Ga^{3+}$; and O represents di-valent host anion oxygen, $O^{2-}$, and $Cr^{4+}$, $AE^{2+}$ and $Er^{3+}$ represent dopant cations where:

$Cr^{4+}$ generally occupies the tetrahedral garnet site substituting for D cations.

$AE^{2+}$ represents alkaline earth (AE) metal dopant cations including $Ca^{2+}$ and/or $Mg^{2+}$ where $Ca^{2+}$ generally occupies the dodecahedral garnet site substituting for C cations, and $Mg^{2+}$ generally occupies the tetrahedral garnet site substituting for D cations.

$Er^{3+}$ generally occupies the dodecahedral garnet site substituting for the C cation.

In an alternative expression, this fluorescent optical material may be described as

$$Cr,AE,Er:RE_3A_2D_3O_{12}, \quad \text{(Formula 2)}$$

where:

RE is a host trivalent rare earth metal cation at a dodecahedral garnet site and comprises $Y^{3+}$, $Lu^{3+}$, and/or $Gd^{3+}$;

A is a host trivalent cation at an octahedral garnet site and comprises $Al^{3+}$, $Ga^{3+}$, and/or $Sc^{3+}$;

D is a host trivalent cation at a tetrahedral garnet site and comprises $Al^{3+}$ and/or $Ga^{3+}$;

O is a host divalent oxygen anion ($O^{2-}$);

Cr is a dopant tetravalent chromium cation ($Cr^{4+}$) and substitutes for D at the tetrahedral garnet site;

AE is a dopant divalent alkaline earth metal cation comprising $Ca^{2+}$ that substitutes for RE at the dodecahedral garnet site and/or $Mg^{2+}$ that substitutes for D at the tetrahedral garnet site; and Er is a dopant trivalent erbium cation ($Er^{3+}$) and substitutes for RE at the dodecahedral garnet site.

In one example, the fluorescent material was obtained utilizing yttrium aluminum garnet (YAG) as the host material doped with Cr4+, Er3+ and Ca2+ where the Ca2+ was the charge compensation ion AE2+ described above. The general chemical formula for this material can be express as: $Cr^{4+}_{(z)}, Ca^{2+}_{(x)}, Er^{3+}_{(y)}:Y^{3+}_{(3-x-y)} Al^{3+}_{(5-z)}O^{2-}_{12}$.

The material described above according to embodiments of the disclosure enables the $^4I_{11/2}$ $Er^{3+}$ excited state to be populated by absorption of ~1-micron laser energy through co-doping $Cr^{4+}$ ions with $Er^{3+}$ ions in the garnet lattice. $Cr^{4+}$-doped crystalline materials have the unique characteristics of being both a saturable absorber for passive q-switch of 1-micron lasers such as those based on $Nd^{3+}$ and $Yb^{3+}$ doped laser gain media, as well as being a tunable laser in the spectral range of 1.3-1.6 microns.

Figure 8B:
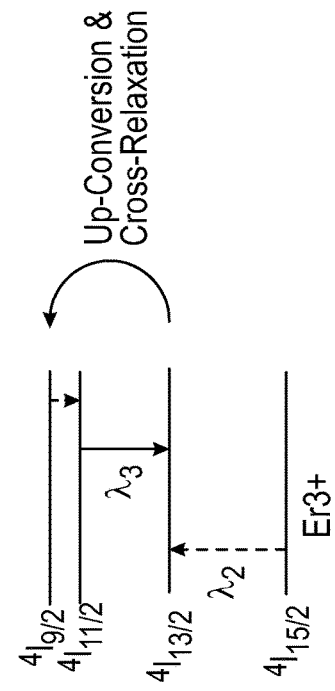
FIG. 8B illustrates the energy level scheme of the dodecahedral coordinated $Er^{3+}$ ion in a fluorescent optical material in accordance with an embodiment of the disclosure.
Figure 8A:
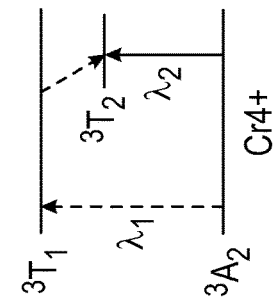
FIG. 8A illustrates the energy level scheme of the tetrahedral coordinated $Cr^{4+}$ ion in a fluorescent optical material in accordance with an embodiment of the disclosure.

The novel fluorescent material according to embodiments of the present disclosure utilizes both the 1-micron absorption and 1.3-1.6-micron emission of the Cr4+ ion. As shown in FIG. 8A, which illustrates the energy level scheme of the tetrahedral coordinated $Cr^{4+}$ ion (Td symmetry) and FIG. 8B, which illustrates the energy level scheme of the dodecahedral coordinated $Er^{3+}$ ion, the Cr4+ ions in garnet hosts exhibit infrared absorption near 1-micron (labeled "$\lambda_1$" in FIG. 8A) via the 3A2→3T1 transition, and broad emission near 1.5 microns (labeled "$\lambda_2$" in FIGS. 8A and 8B) via the 3T2→3A2 transition. In this new co-doped material, the $Er^{3+}$ ions re-absorb the $Cr^{4+}$ 1.3-1.6 micron emission ($\lambda_2$) via the $^4I_{15/2}$-$^4I_{13/2}$ transition, and subsequently emits fluorescence in the 3-micron region (labeled "$\lambda_3$" in FIG. 8B) via the $^4I_{11/2}$-$^4I_{13/2}$ transition. The $Er^{3+}$ $^4I_{11/2}$ energy level is populated via up-conversion, cross-relaxation, and non-radiative decay processes. For a given garnet host, the absolute and relative Cr4+ and Er3+ concentrations may be varied to adjust the relative strength of the 1.5-micron and 3-micron emissions according to embodiments of the disclosure. For example, it was observed for a fixed Er3+ concentration of 50% that MWIR emission intensity increased with increasing amounts of $Cr^{4+}$ concentration.

A method of producing the novel fluorescent material discussed above will now be described in accordance with one or more embodiments of the disclosure. In general, doped garnet materials may be produced using various production methods including but not limited to optical ceramics, and bulk single-crystal growth techniques. The method according to embodiments of the disclosure combines three dopants into the garnet lattice. In one embodiment, single crystal $Cr^{4+}_{(z)}, Ca^{2+}_{(x)}, Er^{3+}_{(y)}:Y^{3+}_{(3-x-y)}Al^{3+}_{(5-z)}O^{2-}_{12}$ was synthesized using the Czochralski crystal growth process. More specifically in one example process, a chemical composition of the following was loaded into a 500 ml volume, 3" dia×4.5" tall iridium crucible:

$Cr_2O_3$=2.1 grams;
$CaCO_3$=4.2 grams;
$Er_2O_3$=762.7 grams;

$Y_2O_3$=450.0 grams; and
$Al_2O$=676.3 grams;

More generally, expressed in terms of Formula 2 above, the chemical composition may include:

- $Cr_2O_3$ in an amount ranging from about 0.01 to about 0.2 mol percent of the mixture (e.g., about 0.13 mol percent of the mixture, or about 0.11 parts by weight per 100 parts of the mixture by weight);
- $AECO_3$ (e.g., $CaCO_3$) and/or AEO (e.g., MgO) in an amount ranging from about 0.01 to about 0.5 mol percent of the mixture (e.g., about 0.39 mol percent of the mixture, or about 0.22 parts by weight per 100 parts of the mixture by weight if $AECO_3$ is $CaCO_3$);
- $Er_2O_3$ in an amount ranging from about 15 to about 25 mol percent of the mixture (e.g., about 18.7 mol percent of the mixture or about 40.24 parts by weight per 100 parts of the mixture by weight);
- $RE_2O_3$ in an amount ranging from about 15 to about 25 mol percent of the mixture (e.g., about 18.7 mol percent of the mixture, or about 23.74 parts by weight per 100 parts of the mixture by weight if $RE_2O_3$ is $Y_2O_3$);
- $A_2O_3$ in an amount ranging from about 30 to about 45 mol percent of the mixture (e.g., about 37.3 mol percent of the mixture); and
- $D_2O_3$ in an amount ranging from about 20 to about 30 mol percent of the mixture (e.g., about 24.8 mol percent of the mixture, or if $A_2O_3$ and $D_2O_3$ are $Al_2O_3$, $Al_2O_3$ in an amount of about 35.68 parts by weight per 100 parts of the mixture by weight).

The crucible containing a mixture of the chemical composition above was placed in to the growth system comprising a 30 kHz RF (radio frequency) power supply, a growth camber containing the RF coupling coil, zirconium oxide, aluminum oxide and quartz insulation materials in a water cooled enclosure (e.g., bell jar) with a controlled atmosphere and electronic control system. Diameter control was accomplished by controlling the RF power supply output in response to the mass of the growing crystal. The crucible with the oxide mixture was heated about 1960 degrees Celcius under a high purity $N_2$ atmosphere with 4000 ppm of $O_2$ partial pressure. An <100> oriented YAG seed (e.g., a small rod shaped crystal) was immersed into the molten mixture. Applying a withdrawal rate of 0.04"/hr along with a rotation rate of 10 rpm, crystal growth was initiated. Growth continued for 134.5 hrs followed by a 8-hour cool-down period. The method according to this example embodiment produced a dark brown Er3+, Cr4+:YAG crystal structure approximately 1" diameter by 4.5" length.

Therefore, using the method above in accordance with embodiments of the disclosure, a fluorescent optical material suitable for implementing a target object, such as target object 306, 406, or 606, may be produced that can absorb broadly in the 1-micron regions (e.g., within a NIR waveband) and subsequently emit in both the 1.5-micron region (e.g., within a SWIR waveband) and 3-micron region (e.g., within a MWIR waveband). Furthermore, for a given garnet host, the absolute and relative $Cr^{4+}$ and $Er^{3+}$ concentrations may be varied to adjust the relative strength of the 1.5-micron and 3-micron emissions according to embodiments of the disclosure. For example, it was observed that MWIR emission intensity increased with increasing amounts of $Cr^{4+}$ concentration. Additionally, while $Cr^{4+}$ ions exhibit excited state absorption in most Garnet hosts and excited state absorption (ESA) can reduce the 1.3-1.6 micron fluorescence intensity, the ESA may be minimized by aligning the input polarization to one of the crystallographic <100> axis according to some embodiments of the disclosure. For example, it was verified that the MWIR emission intensity increase when the input polarization is aligned to the <100> crystallographic axis.

Where applicable, the ordering of various steps described herein can be changed, combined into composite steps, and/or separated into sub-steps to provide features described herein. Embodiments described above illustrate but do not limit the invention. It should also be understood that numerous modifications and variations are possible in accordance with the principles of the invention. Accordingly, the scope of the invention is defined only by the following claims.

What is claimed is:

1. An apparatus for use in boresighting a light source emitting a laser beam at a first wavelength to an imaging sensor having a detectable waveband, the apparatus comprising:
   - a catadioptric element configured to transmit and focus the laser beam onto a location in a focal plane;
   - a target object positioned substantially at the focal plane and configured to emit, from a spot corresponding to the location of the focused laser beam, light having a second wavelength within the detectable waveband of the imaging sensor in response to receiving the laser beam having the first wavelength; and
   - wherein the catadioptric element is further configured as a collimating mirror to reflect the emitted light from the spot on the target object into a collimated emitted light having the second wavelength to be detected by the imaging sensor for indicating the location of the focused laser beam.

2. The apparatus of claim 1, wherein the catadioptric element is a positive meniscus lens with an outer surface having a first radius of curvature and an inner surface having a second radius of curvature larger than the first radius of curvature, the positive meniscus lens being configured to focus the laser beam entering the outer surface and exiting the inner surface onto the location in the focal plane.

3. The apparatus of claim 2, wherein the inner surface of the positive meniscus lens comprises a dichroic coating configured to transmit light having the first wavelength and reflect light having the second wavelength, whereby the inner surface of the positive meniscus lens is configured as the collimating mirror.

4. The apparatus of claim 2, wherein the first and the second radii of curvature of the positive meniscus lens are chosen to provide a focal length with respect to the focused laser beam that is substantially same as a focal length of the collimating mirror.

5. The apparatus of claim 1, wherein:
   - the imaging sensor is a mid-wave infrared (MWIR) imaging sensor having the detectable waveband within a range of approximately 3 to 8 micrometers;
   - the first wavelength is between approximately 600 nanometers and 1100 nanometers; and
   - the light source is a Nd:YAG or a Yb:YAG laser source configured to emit the laser beam at a wavelength in a range from 900 to 1100 nanometers.

6. The apparatus of claim 1, further comprising:
   - an input mirror positioned to receive the laser beam from the light source and direct the laser beam toward the catadioptric element; and/or
   - an output mirror positioned to receive the collimated emitted light from the catadioptric element and direct the collimated emitted light toward the imaging sensor; and
   - wherein the input mirror or the output mirror comprises a fold mirror configured to compensate for tilting of the apparatus relative to the light source and the imaging sensor by making the laser beam to the input mirror and the collimated emitted light from the output mirror substantially parallel to each other.

7. The apparatus of claim 6, further comprising a lens disposed between the input mirror and the catadioptric element, the lens being configured to compensate for angular magnification introduced by the catadioptric element.

8. The apparatus of claim 6, wherein:
the imaging sensor is a first imaging sensor and the detectable waveband is a first detectable waveband;
the target object is further configured to emit light having a third wavelength within a second detectable waveband of a second imaging sensor in response to receiving the laser beam having the first wavelength, the first and the second detectable wavebands being different from each other;
the catadioptric element is further configured to reflect the emitted light having the third wavelength into a collimated emitted light having the third wavelength; and
the apparatus further comprises a dichroic mirror disposed between the catadioptric element and the output mirror, the dichroic mirror being configured to pass the collimated emitted light having the second wavelength to the output mirror and reflect the collimated emitted light having the third wavelength toward the second imaging sensor for boresighting the second imaging sensor to the light source;
wherein the first imaging sensor is a short-wave infrared (SWIR) imaging sensor having the first detectable waveband within a range of approximately 1 to 3 micrometers and the second imaging sensor is a mid-wave infrared (MWIR) imaging sensor having the second detectable waveband within a range of approximately 3 to 8 micrometers.

9. The apparatus of claim 6, wherein the imaging sensor is a first imaging sensor and the detectable waveband is a first detectable waveband, the apparatus further comprising a beam splitter disposed between the input mirror and the catadioptric element, the beam splitter being configured to split the laser beam from the input mirror into a first laser beam directed toward the catadioptric element and a second laser beam directed toward a second imaging sensor having a second detectable waveband that includes the first wavelength for boresighting the second imaging sensor to the light source; and
wherein the first imaging sensor is a mid-wave infrared (MWIR) imaging sensor having the first detectable waveband within a range of approximately 3 to 8 micrometers and the second imaging sensor is a visible light-near infrared (Vis-NIR) imaging sensor having the second detectable waveband within a range of approximately 0.3 to 1 micrometers.

10. The apparatus of claim 1, wherein the target object comprises a fluorescent material configured to absorb light having the first wavelength and emit light having the second wavelength by atomic electron transition.

11. The apparatus of claim 10, wherein the fluorescent material is a doped garnet material having a structure of Formula I $$Cr,AE,Er:RE_3A_2D_3O_{12} \qquad (I)$$

wherein:
RE is a host trivalent rare earth metal cation at a dodecahedral garnet site and comprises $Y^{3+}$, $Lu^{3+}$, and/or $Gd^{3+}$;

A is a host trivalent cation at an octahedral garnet site and comprises $Al^{3+}$, $Ga^{3+}$, and/or $Sc^{3+}$;
D is a host trivalent cation at a tetrahedral garnet site and comprises $Al^{3+}$ and/or $Ga^{3+}$;
O is a host divalent oxygen anion ($O^{2-}$);
Cr is a dopant tetravalent chromium cation ($Cr^{4+}$) and substitutes for D at the tetrahedral garnet site;
AE is a dopant divalent alkaline earth metal cation comprising $Ca^{2+}$ that substitutes for RE at the dodecahedral garnet site and/or $Mg^{2+}$ that substitutes for D at the tetrahedral garnet site; and
Er is a dopant trivalent erbium cation ($Er^{3+}$) and substitutes for RE at the dodecahedral garnet site.

12. A method of boresighting a light source emitting a laser beam at a first wavelength to an imaging sensor having a detectable waveband, the method comprising:
receiving the laser beam at a catadioptric element;
transmitting and focusing the laser beam by the catadioptric element onto a location in a focal plane associated with the catadioptric element;
receiving, by a target object positioned substantially at the focal plane, the laser beam focused at the location in the focal plane;
emitting, from a spot on the target object corresponding to the location of the focused laser light, light having a second wavelength within the detectable waveband of the imaging sensor in response to the receiving of the focused laser beam; and
reflecting, by a collimating mirror provided by the catadioptric element, the emitted light from the spot on the target object into a collimated emitted light having the second wavelength to be detected by the imaging sensor for indicating the location of the focused laser beam.

13. The method of claim 12, wherein the transmitting and focusing of the laser beam and the reflecting of the emitted light by the catadioptric element is by a positive meniscus lens with an outer surface having a first radius of curvature and an inner surface having a second radius of curvature larger than the first radius of curvature, the laser beam entering the outer surface and exiting the inner surface to be focused onto the location in the focal plane.

14. The method of claim 13, wherein the reflecting of the emitted light is by the inner surface of the positive meniscus lens that comprises a dichroic coating configured to transmit light having the first wavelength and reflect light having the second wavelength to provide the collimating mirror.

15. The method of claim 13, wherein the first and the second radii of curvature of the positive meniscus lens are chosen to provide a focal length with respect to the focused laser beam that is substantially same as a focal length of the collimating mirror.

16. The method of claim 12, wherein:
the imaging sensor is a mid-wave infrared (MWIR) imaging sensor having the detectable waveband within a range of approximately 3 to 8 micrometers;
the first wavelength is between approximately 600 nanometers and 1100 nanometers; and
wherein the light source is a Nd:YAG laser source configured to emit the laser beam at 1064 nanometers or a Yb:YAG laser source configured to emit the laser beam at 1030 nanometers.

17. The method of claim 12, further comprising:
receiving the laser beam from the light source and directing the laser beam toward the catadioptric element by an input mirror, prior to receiving of the laser beam by the catadioptric element; and/or receiving the collimated emitted light from the catadioptric element and directing the collimated emitted light toward the imaging sensor by an output mirror, after the reflecting of the emitted light by the catadioptric element; and wherein the input mirror or the output mirror comprises a fold mirror, the method further comprising compensating for tilting of an apparatus relative to the light source and the imaging sensor by making the laser beam to the input mirror and the collimated emitted light from the output mirror substantially parallel to each other using the fold mirror.

18. The method of claim 17, further comprising compensating for angular magnification introduced by the catadioptric element using a lens disposed between the input mirror and the catadioptric element.

19. The method of claim 17, wherein the imaging sensor is a first imaging sensor and the detectable waveband is a first detectable waveband, the method further comprising:
emitting, from the spot on the target object corresponding to the location of the focused laser light, light having a third wavelength within a second detectable waveband of a second imaging sensor in response to the receiving of the focused laser beam, the first and the second detectable wavebands being different from each other;
reflecting, by the collimating mirror provided by the catadioptric element, the emitted light having the third wavelength into a collimated emitted light having the third wavelength; and
prior to the receiving of the emitted light by the output mirror, passing the collimated emitted light having the second wavelength to the output mirror and reflecting the collimated emitted light having the third wavelength toward the second imaging sensor for boresighting the second imaging sensor to the light source;

wherein the first imaging sensor is a short-wave infrared (SWIR) imaging sensor having the first detectable waveband within a range of approximately 1 to 3 micrometers and the second imaging sensor is a mid-wave infrared (MWIR) imaging sensor having the second detectable waveband within a range of approximately 3 to 8 micrometers.

20. The method of claim 17, wherein the imaging sensor is a first imaging sensor and the detectable waveband is a first detectable waveband, the method further comprising, prior to the receiving of the laser beam by the catadioptric element, splitting the laser beam from the input mirror into a first laser beam directed toward the catadioptric element and a second laser beam directed toward a second imaging sensor having a second detectable waveband that includes the first wavelength for boresighting the second imaging sensor to the light source; and wherein the first imaging sensor is a mid-wave infrared (MWIR) imaging sensor having the first detectable waveband within a range of approximately 3 to 8 micrometers and the second imaging sensor is a visible light-near infrared (Vis-NIR) imaging sensor having the second detectable waveband within a range of approximately 0.3 to 1 micrometers.

21. The method of claim 12, wherein the emitting of the light having the second wavelength comprises absorbing light having the first wavelength and emitting light having the second wavelength by a fluorescent material comprised in the target object; and
wherein the fluorescent material is a doped garnet material.

22. The method of claim 12, wherein the target object has an absorption at a near infrared (NIR) region and an emission in a short-wave infrared (SWIR) region and a mid-wave infrared (MWIR) region.

\* \* \* \* \*

UNITED STATES PATENT AND TRADEMARK OFFICE
CERTIFICATE OF CORRECTION

PATENT NO. : 10,335,896 B2  
APPLICATION NO. : 15/650542  
DATED : July 2, 2019  
INVENTOR(S) : Lawrence Berg et al.

Page 1 of 1

It is certified that error appears in the above-identified patent and that said Letters Patent is hereby corrected as shown below:

In the Specification

In the Detailed Description:

In Column 3, Line 20, change "1.064 um or 1.030 urn" to --"1.064 um or 1.030 um--

In Column 8, Line 64, change "(indicated as "AIR @" to --(indicated as "A/R @--

In Column 10, Lines 60-61, change "at wavelength to imaging sensor" to --at wavelength $\lambda_p$ to imaging sensor--

In Column 16, Lines 51-52, change "and 3.3 urn radiation" to --and 3.3 um radiation--

In Column 17, Line 3, change "1.064 um or 1.030 urn wavelengths" to --1.064 um or 1.030 um wavelengths--

In Column 18, Lines 36-37, change "(labeled "$\lambda_1$" in FIG. 8A)" to --(labeled "$\lambda1$" in FIG. 8A)--

Signed and Sealed this  
Fifth Day of May, 2020

Andrei Iancu  
*Director of the United States Patent and Trademark Office*